United States Patent
Kubota et al.

(10) Patent No.: US 11,479,876 B2
(45) Date of Patent: *Oct. 25, 2022

(54) METHOD FOR PRODUCING GAN LAMINATE SUBSTRATE HAVING FRONT SURFACE WHICH IS GA POLARITY SURFACE

(71) Applicant: Shin-Etsu Chemical Co., Ltd., Tokyo (JP)

(72) Inventors: Yoshihiro Kubota, Annaka (JP); Kazutoshi Nagata, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/266,178

(22) PCT Filed: Aug. 1, 2019

(86) PCT No.: PCT/JP2019/030164
§ 371 (c)(1),
(2) Date: Feb. 5, 2021

(87) PCT Pub. No.: WO2020/031829
PCT Pub. Date: Feb. 13, 2020

(65) Prior Publication Data
US 2021/0301419 A1    Sep. 30, 2021

(30) Foreign Application Priority Data
Aug. 9, 2018 (JP) .............................. JP2018-149939

(51) Int. Cl.
C30B 25/18 (2006.01)
C30B 29/40 (2006.01)
(Continued)

(52) U.S. Cl.
CPC .......... C30B 25/186 (2013.01); C30B 25/183 (2013.01); C30B 29/406 (2013.01);
(Continued)

(58) Field of Classification Search
CPC ......... C30B 25/00; C30B 25/02; C30B 25/18; C30B 25/183; C30B 25/186; C30B 25/20;
(Continued)

(56) References Cited

U.S. PATENT DOCUMENTS

2009/0221131 A1    9/2009  Kubota et al.
2009/0278233 A1*  11/2009  Pinnington ....... H01L 21/02389
                                                    257/617
(Continued)

FOREIGN PATENT DOCUMENTS

JP    2009-231816 A    10/2009
JP    2016-511934 A     4/2016
(Continued)

OTHER PUBLICATIONS

International Search Report dated Oct. 21, 2019, issued in counterpart International Application No. PCT/JP2019/030164 (1 page).

*Primary Examiner* — Kenneth A Bratland, Jr.
(74) *Attorney, Agent, or Firm* — WHDA, LLP

(57) ABSTRACT

The present invention includes: transferring a C-plane sapphire thin film $1t$ having an off-angle of 0.5-5° onto a handle substrate composed of a ceramic material having a coefficient of thermal expansion at 800 K that is greater than that of silicon and less than that of C-plane sapphire; performing high-temperature nitriding treatment on the GaN epitaxial growth substrate 11 and covering the surface of the C-plane sapphire thin film $1t$ with a surface treatment layer 11a made of AlN; having GaN grow epitaxially on the surface treatment layer 11a; ion-implanting a GaN film 13; pasting and bonding together the GaN film-side surface of the ion-
(Continued)

implanted GaN film carrier and a support substrate 12; performing peeling at an ion implantation region $13_{ion}$ in the GaN film 13 and transferring a GaN thin film 13a onto the support substrate 12; and obtaining a GaN laminate substrate 10.

13 Claims, 2 Drawing Sheets

(51) Int. Cl.
*C30B 31/22* (2006.01)
*C30B 33/06* (2006.01)
*H01L 21/02* (2006.01)
*H01L 21/78* (2006.01)

(52) U.S. Cl.
CPC .............. *C30B 31/22* (2013.01); *C30B 33/06* (2013.01); *H01L 21/0242* (2013.01); *H01L 21/0254* (2013.01); *H01L 21/0262* (2013.01); *H01L 21/02433* (2013.01); *H01L 21/02458* (2013.01); *H01L 21/7806* (2013.01)

(58) Field of Classification Search
CPC ....... C30B 25/205; C30B 25/22; C30B 29/00; C30B 29/10; C30B 29/40; C30B 29/403; C30B 29/406; C30B 31/20; C30B 31/22; C30B 33/06; H01L 21/0242; H01L 21/02433; H01L 21/02458; H01L 21/0254; H01L 21/0262; H01L 21/7806; C23C 16/22; C23C 16/30; C23C 16/301; C23C 16/303
USPC ........... 117/84, 88–90, 92, 94, 97, 101, 103, 117/105–106, 937, 952
See application file for complete search history.

(56) References Cited

U.S. PATENT DOCUMENTS

| | | |
|---|---|---|
| 2013/0069075 A1 | 3/2013 | Fujikura et al. |
| 2019/0024259 A1 | 1/2019 | Henley et al. |
| 2021/0111076 A1* | 4/2021 | Sekiyama ........... H01L 21/7813 |

FOREIGN PATENT DOCUMENTS

| | | | | |
|---|---|---|---|---|
| JP | 2017-193486 A | 10/2017 | | |
| JP | 2018-24538 A | 2/2018 | | |
| WO | WO-2017104799 A1 * | 6/2017 | ............. | B32B 17/06 |

* cited by examiner (a)

(b)

(c)

(d)

(e)

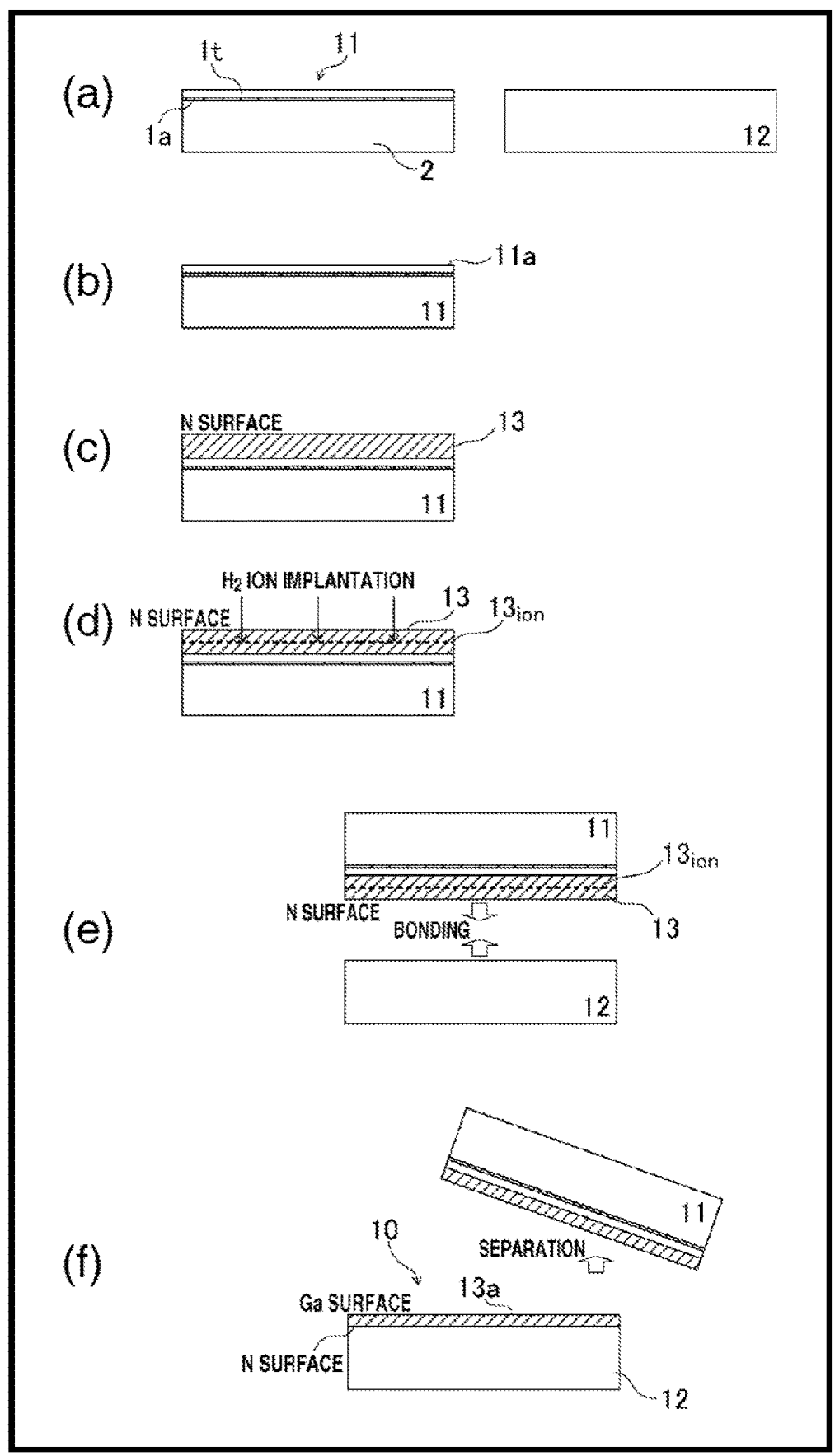

METHOD FOR PRODUCING GAN LAMINATE SUBSTRATE HAVING FRONT SURFACE WHICH IS GA POLARITY SURFACE

TECHNICAL FIELD

This invention relates to a method for producing a GaN laminate substrate having a front surface which is a Ga polarity surface or Ga surface.

BACKGROUND ART

Because of a broader bandgap than Si and GaAs, crystalline GaN is regarded promising in high-speed power device application. Among others, bulk GaN substrates having good crystallinity are small in diameter and very expensive so that their widespread use is inhibited.

In contrast, GaN thin films having a relatively large diameter are obtainable from hetero-epitaxial growth of GaN on AlN substrates or $Al_2O_3$ (sapphire) substrates by hydride vapor phase epitaxy (HVPE) or metal-organic chemical vapor deposition (MOCVD). But, few films have acceptable properties.

Also, laminate substrates having GaN thin films formed on Si substrates which are generally widespread as the semiconductor material are fully expectable as high-performance device substrates because excellent fundamental properties of GaN are available and the advanced processing technology of Si semiconductor devices is applicable.

As the means for forming a GaN thin film on a Si substrate, the method of depositing GaN directly on Si<111> face by hetero-epitaxial growth technique has been developed. Substrates having a diameter of 200 mm are already used in practice.

However, in order to obtain GaN of good crystallinity with this method, a multiple thick buffer layer must be formed between the Si substrate and the GaN thin film. This is because the GaN film and the Si substrate have largely different coefficients of thermal expansion and the crystals thereof have inconsistent lattice constants. Then the laminate substrate tends to undergo warpage. The warpage increases as the GaN film becomes thicker or as the diameter of the substrate becomes larger, raising the problem that a variety of crystal defects are generated and enlarged. If the warpage of the laminate substrate increases, the laminate substrate is eventually broken. Even when the laminate substrate is not broken, various problems arise in the semiconductor device process. A serious problem arises particularly in the exposure process during microfabrication. Then for the purpose of mitigating the warpage, a thick buffer layer must be interposed between the Si substrate and the GaN thin film, the buffer layer having a coefficient of linear expansion and a lattice constant both controlled intermediate between the two materials.

This method, however, is still difficult to thicken a GaN layer having good properties on the laminate substrate.

As the means for solving the outstanding problems, a method for producing a GaN laminate substrate by the following transfer procedure is contemplated.

Namely, a first substrate is furnished and a GaN film having a predetermined thickness is epitaxially grown on its surface. Next, the substrate is subjected to ion implantation to form an embrittled layer (ion-implanted region) at a certain depth from the surface. The first substrate is bonded to a second substrate, after which separation is carried out along the embrittled layer to transfer a GaN thin film to the second substrate, yielding a GaN laminate substrate.

At this point of time, the growth or front surface side becomes a Ga polarity surface (referred to as Ga surface, hereinafter) in the case of general epitaxial growth of GaN (that GaN epitaxial growth film formed on the first substrate). Therefore, the ion-implanted surface side becomes a Ga surface, and the surface after the transfer to the second substrate as a result of separation becomes a N polarity surface (N surface). Since the Ga surface capable of providing high properties to the device fabrication surface is generally utilized in the electronic part application, it is necessary that the GaN thin film transferred to the second substrate be again bonded and transferred to a third substrate so that the front surface becomes a Ga surface. Heretofore many studies have been made on the attempt that the surface after the transfer to the second substrate as a result of separation becomes a Ga surface (that is, the epitaxial growth surface on the first substrate becomes an N surface). However, the epitaxial growth on the N surface results in a GaN film having poor crystallinity and flatness, which is difficult to use in the device application.

Since the above-mentioned habits of GaN epitaxial growth necessitate that the growth surface (front surface) of the final GaN laminate substrate be a Ga surface, it is inevitable to take the trouble of repeating the transfer of GaN thin film twice. This complicates the process and causes low manufacture yields and high costs.

It is noted that one preceding technology pertinent to the present invention is JP-A 2016-511934 (Patent Document 1).

PRIOR ART DOCUMENTS

Patent Document

Patent Document 1: JP-A 2016-511934

SUMMARY OF INVENTION

Technical Problem

An object of the invention, which has been made under the above-mentioned circumstances, is to provide a method for producing a GaN laminate substrate having a Ga surface as the front surface and good crystallinity and flatness in a simple manner, wherein the GaN laminate substrate can be produced to a large diameter of at least 150 mm.

Solution to Problem

To attain the above and other objects, the present invention provides a method for producing a GaN laminate substrate as defined below.

1.
A method for producing a GaN laminate substrate, comprising the steps of:
transferring a C-face sapphire thin film, which is separated from a C-face sapphire substrate having an off-angle of 0.5 to 5° by the ion-implantation separation technique, onto a handle substrate composed of a glass, ceramic or single crystal material having a coefficient of thermal expansion at 800K which is greater than that of silicon and less than that of C-face sapphire, to construct a GaN epitaxial growth substrate;
performing high-temperature nitriding treatment on the GaN epitaxial growth substrate at 800 to 1,000° C. and/or deposition treatment of crystalline AlN on the C-face sapphire thin film of the GaN epitaxial growth substrate, for thereby covering the surface of the C-face sapphire thin film with a surface treated layer of AlN;

effecting GaN epitaxial growth on the surface treated layer of the surface treated GaN epitaxial growth substrate, to construct a GaN film carrier having a front surface which is an N-polarity surface;

subjecting the GaN film to ion implantation to form an ion-implanted region;

attaching and bonding together the GaN film-side surface of the ion-implanted GaN film carrier and a support substrate; and separating a GaN thin film from the GaN film along the ion-implanted region and transferring the GaN thin film onto the support substrate, thereby obtaining a GaN laminate substrate having the GaN thin film on the support substrate, the GaN thin film having a front surface which is a Ga-polarity surface.

2.

The method of 1 wherein the handle substrate is composed of a borosilicate glass, GaN sintered body, AlN sintered body or GaAs single crystal.

3.

The method of 1 or 2 wherein in the step of transferring a C-face sapphire thin film onto a handle substrate, a thin film of silicon oxide, silicon nitride or silicon oxynitride is interposed between the handle substrate and the C-face sapphire thin film.

4.

The method of any one of 1 to 3 wherein the GaN epitaxial growth substrate has a warpage of up to 300 μm.

5.

The method of any one of 1 to 4 wherein the step of effecting GaN epitaxial growth is at a temperature from higher than 1,000° C. to 1,200° C.

6.

The method of any one of 1 to 5 wherein the step of effecting GaN epitaxial growth is by the MOCVD technique.

7.

The method of any one of 1 to 6 wherein after the surface treatment of the C-face sapphire substrate, a GaN buffer layer is formed on the surface treated layer at 700° C. or lower, and the GaN epitaxial growth is then effected on the GaN buffer layer.

8.

The method of 7 wherein the GaN buffer layer has a thickness of 20 to 40 nm.

9.

The method of any one of 1 to 8 wherein after the formation of the GaN film by epitaxial growth, a silicon oxide film is formed on the GaN film to construct the GaN film carrier.

10.

The method of any one of 1 to 9 wherein prior to the ion implantation, the surface of the GaN film carrier subject to ion implantation is smoothed to an arithmetic average roughness Ra of 0.3 nm or less.

11.

The method of any one of 1 to 10 wherein the ion implantation to the GaN film is a treatment using hydrogen ions ($H^+$) and/or hydrogen molecule ions ($H_2^+$) in an implantation energy of 100 to 160 keV and a dose of $1.0 \times 10^{17}$ to $3.5 \times 10^{17}$ atoms/cm$^2$.

12.

The method of any one of 1 to 11 wherein the support substrate is made of Si, $Al_2O_3$, SiC, AlN or $SiO_2$.

13.

The method of 12 wherein the support substrate has a silicon oxide film formed on its surface to be bonded to the GaN film carrier, except the support substrate which is made of $SiO_2$.

Advantageous Effects of Invention

According to the invention, after a C-face sapphire thin film having a predetermined off angle in a GaN epitaxial growth substrate is subjected to predetermined surface treatment, GaN is epitaxially grown on the treated thin film. Thus, a GaN film having a N polarity surface as the front surface and good crystallinity can be formed. Through the only one GaN thin film transfer step, a GaN laminate substrate having a Ga polarity surface as the front surface can be produced. Since the number of transfer steps is smaller than in the prior art, a process cost reduction becomes possible. Since the GaN film which is lost by transfer is eliminated, the material cost can be reduced. While the in-plane variation of film thickness and surface roughness increase in proportion to the number of transfer steps, such increases are suppressed because of a smaller number of transfer steps than in the prior art.

Further, since the difference in CTE between the handle substrate and the GaN film of the GaN epitaxial growth substrate is controlled minimal, the GaN film carrier obtained from epitaxial growth of a GaN film is suppressed in warpage. This enables GaN film transfer from the GaN film carrier having a large diameter. Thus, a GaN laminate substrate having a Ga surface as the front surface and good crystallinity and flatness can be produced to a large diameter.

Also, according to the invention, an epitaxially grown substrate which can be readily produced to a large diameter is used as the donor substrate for GaN thin film transfer. A GaN laminate substrate having a large diameter is obtainable at a low cost as compared with the use of expensive, small diameter bulk GaN substrates as the donor substrate. By using the resulting GaN laminate substrate having the front surface of a Ga polarity surface as a GaN template substrate and further effecting epitaxial growth of GaN thereon, a GaN substrate having a high pressure resistance, high properties and low cost is obtainable.

BRIEF DESCRIPTION OF DRAWINGS

FIG. 2 illustrates, among steps of the method for producing a GaN laminate substrate according to one embodiment of the invention, those steps taken until a GaN laminate substrate is produced using the GaN epitaxial growth substrate obtained in FIG. 1, (a) of furnishing the GaN epitaxial growth substrate and a support substrate, (b) of surface treatment of the GaN epitaxial growth substrate, (c) GaN epitaxial growth, (d) ion implantation treatment, (e) of attaching and bonding, and (f) of separating and transferring a GaN thin film.

DESCRIPTION OF EMBODIMENTS

Now the method for producing a GaN laminate substrate according to the invention is described. It is noted that the numerical range of "A to B" is inclusive of the endpoints of the range, meaning from more than or equal to A to less than or equal to B.

The method for producing a GaN laminate substrate according to the invention comprises the steps of transferring a C-face sapphire thin film, which is separated from a C-face sapphire substrate having an off-angle of 0.5 to 5° by the ion-implantation separation technique, onto a handle substrate composed of a glass, ceramic or single crystal material having a coefficient of thermal expansion at 800K which is greater than that of silicon and less than that of C-face sapphire, to construct a GaN epitaxial growth substrate; performing high-temperature nitriding treatment on the GaN epitaxial growth substrate at 800 to 1,000° C. and/or deposition treatment of crystalline AlN on the C-face sapphire thin film of the GaN epitaxial growth substrate, for thereby covering the surface of the C-face sapphire thin film with a surface treated layer of AlN; effecting GaN epitaxial growth on the surface treated layer of the surface treated GaN epitaxial growth substrate, to construct a GaN film carrier having a front surface which is an N-polarity surface; subjecting the GaN film to ion implantation to form an ion-implanted region; attaching and bonding together the GaN film-side surface of the ion-implanted GaN film carrier and a support substrate; and separating a GaN thin film from the GaN film along the ion-implanted region and transferring the GaN thin film onto the support substrate, thereby obtaining a GaN laminate substrate having the GaN thin film on the support substrate, the GaN thin film having a front surface which is a Ga-polarity surface.

Figure 1:
FIG. 1 illustrates, among steps of the method for producing a GaN laminate substrate according to one embodiment of the invention, those steps taken until a GaN epitaxial growth substrate is prepared, (a) of furnishing a C-face sapphire substrate and a handle substrate, (b) of forming a thin film on the C-face sapphire substrate, (c) of ion implantation treatment, (d) of attaching and bonding, and (e) of separating and transferring a C-face sapphire thin film.
Figure 1:
Figure 1:
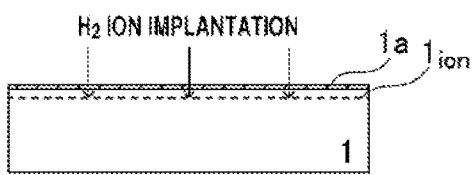
Figure 1:
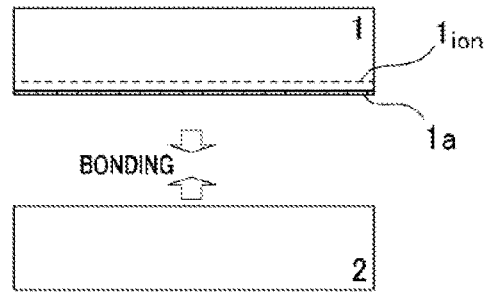
Figure 1:
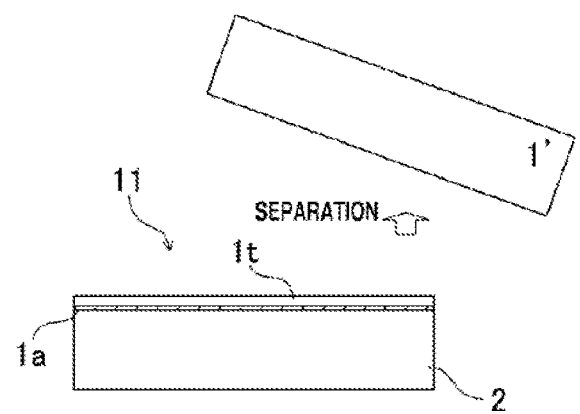

Referring to FIGS. 1 and 2, the method for producing a GaN laminate substrate according to the invention described in detail.

In the method for producing a GaN laminate substrate according to the invention, first a GaN epitaxial growth substrate is prepared, as shown in FIG. 1, by carrying out step (a) of furnishing a C-face sapphire substrate and a handle substrate (step 1-1), (b) of forming a thin film on the C-face sapphire substrate (step 1-2), (c) of ion implantation treatment to the C-face sapphire substrate (step 1-3), (d) of attaching and bonding the C-face sapphire substrate to the handle substrate (step 1-4), and (e) of separating and transferring a C-face sapphire thin film (step 1-5) in sequence.

(Step 1-1: Furnishing C-Face Sapphire Substrate and Handle Substrate)

First, there are furnished a C-face sapphire substrate 1 and a handle substrate 2 (FIG. 1(a)).

The C-face sapphire substrate 1 is a substrate of sapphire ($\alpha$-$Al_2O_3$) wherein a substrate surface is given by C face ((0001) plane). The C-face sapphire substrate 1 has a c-axis off angle (referred to as off angle, hereinafter) of 0.5 to 5°, preferably 2 to 3°. Setting an off angle within the range ensures that when a GaN film 13 is formed on a C-face sapphire thin film 1t which is formed from the C-face sapphire substrate 1 via separation and transfer, the GaN film 13 has a front surface which is a N polarity surface (referred to as N surface, hereinafter) and is an epitaxial growth film having improved smoothness and good crystallinity; and that when a part of the GaN film 13 is separated or cleaved by the ion implantation separation method and transferred to a support substrate 12, the transferred thin film 13a has good smoothness. It is noted that the off angle is an angle included when the substrate front surface (surface subject to crystal growth) is slightly inclined from the close-packed plane in a particular direction, and the c-axis off angle refers to the magnitude of inclination of c-axis (normal axis to C face) of the C-face sapphire substrate 1 in a-axis direction.

The handle substrate 2 is a substrate composed of a glass, ceramic or single crystal material having a coefficient of thermal expansion (CTE) at 800K which is greater than that of silicon and less than that of C-face sapphire. It is a base substrate from which a GaN epitaxial growth substrate 11 is prepared by the steps described herein.

The handle substrate 2 is preferably made of a glass, ceramic or single crystal material having a difference ($\Delta\alpha$) between the CTE at the substrate temperature during GaN epitaxial growth, typically 1,000° C. and the CTE at room temperature (20° C.), which is more than that of silicon and less than that of C-face sapphire and more preferably a material which is as close to GaN as possible. Most preferably, the handle substrate 2 is made of borosilicate glass, GaN sintered body, AlN sintered body or GaAs single crystal. Notably examples of the borosilicate glass include borosilicate glass 1 (JR-1) and borosilicate glass 2 (JR-2) as prescribed in JIS R3503:2007.

As used herein, the CTE refers to a coefficient of linear expansion of a material at the predetermined temperature. Since the CTE is a function of temperature, the value at an intermediate temperature between the temperature during epitaxial growth and room temperature is used for judgment in the practice of the invention.

Exemplary CTE values at 800K of typical materials are shown below.

GaN: $6.0 \times 10^{-6}$/K (800K)
C-face sapphire: $8.0 \times 10^{-6}$/K (800K)
AlN: $5.2 \times 10^{-6}$/K (800K)
Si: $4.1 \times 10^{-6}$/K (800K)
GaAs single crystal: $6.9 \times 10^{-6}$/K (800K)

The handle substrate 2 preferably has an arithmetic average roughness Ra (JIS B0601:2013, same hereinafter) of 0.5 nm or less at its front surface. A tighter bond is then established in bonding to the C-face sapphire substrate 1.

(Step 1-2: Forming Thin Film on C-Face Sapphire Substrate)

A thin film 1a is formed on the C-face sapphire substrate 1 (FIG. 1(b))

The thin film 1a intervenes between the C-face sapphire substrate 1 (finally C-face sapphire thin film 1t and the mating handle substrate 2 to improve the bond strength therebetween. The thin film 1a is preferably made of silicon oxide ($SiO_2$), silicon nitride ($Si_3N_4$) or silicon oxynitride ($SiO_xN_y$). The thin film 1a preferably has a thickness of 300 to 1,000 nm.

The thin film 1a may be formed by sputtering, plasma-assisted CVD or other techniques.

This step may be omitted when a sufficient bond strength is available between the C-face sapphire substrate 1 and the handle substrate 2 even without the intervening thin film 1a (that is, the C-face sapphire thin film 1t is transferred to the handle substrate 2 without separation).

(Step 1-3: Ion Implantation Treatment to C-Face Sapphire Substrate 1)

Next, the surface of the C-face sapphire substrate 1 where the thin film 1a has been formed is subjected to ion implantation to define an ion-implanted layer or region $1_{ion}$ in the C-face sapphire substrate 1 (FIG. 1(c)).

Herein, hydrogen ions ($H^+$) and/or hydrogen molecule ions ($H_2^+$) are preferably used as the implanting ion.

The implanting energy, which determines the depth of ion implantation (that is the thickness of separated film or C-face sapphire thin film 1t), is preferably 110 to 160 keV. When the implanting energy is equal to or more than 110 keV, the thickness of the C-face sapphire thin film 1t may be 500 nm or more. If the implanting energy exceeds 160 keV, implanting damages become noticeable, with the risk of degrading the crystallinity of separated thin film.

Also, the dose is preferably $1.0 \times 10^{17}$ to $3.0 \times 10^{17}$ atoms/cm². In this dose range, an ion-implanted region $1_{ion}$ which becomes a separating layer (embrittled layer) can be defined in the C-face sapphire substrate 1. Notably, the ion implantation temperature is room temperature.

The ion implantation treatment may be applied to the C-face sapphire substrate 1 having the thin film 1a as formed thereon in the previous step 1-2. If the front surface of the thin film 1a as formed (or the front surface of the C-face sapphire substrate 1 if the thin film 1a is not formed) is rough, the depth of ion implantation becomes irregular in conformity to the surface roughness or irregularity, and the separating surface (front surface) of C-face sapphire thin film 1t after separation becomes noticeably rough or irregular.

It is then recommended that prior to the ion implantation, the surface of the C-face sapphire substrate 1 subject to ion implantation (that is, the front surface of thin film 1a or the front surface of C-face sapphire substrate 1) be smoothed to an arithmetic average roughness of preferably 0.3 nm or less. For example, the front surface of thin film 1a formed in step 1-2 or the front surface C-face sapphire substrate 1 if thin film 1a is not formed may be smoothed to an arithmetic average roughness Ra of preferably 0.3 nm or less by polishing, typically CMP and/or etching.

Now that the surface of the C-face sapphire substrate 1 subject to ion implantation (that is, the front surface of thin film 1a or the front surface of C-face sapphire substrate 1) is smoothed as described above, the ion implantation depth in the subsequent ion implantation treatment becomes uniform and hence, a separated/transferred layer (C-face sapphire thin film 1t) having a smooth surface (reduced surface roughness) is obtained after attachment to the handle substrate 2 and subsequent separation.

(Step 1-4: Attaching and Bonding C-Face Sapphire Substrate 1 to Handle Substrate 2)

Next, the front surface of thin film 1a on the ion-implanted C-face sapphire substrate 1 (or the surface of C-face sapphire substrate 1 if the thin film 1a is not formed) is attached and bonded to the handle substrate 2 (FIG. 1(d)).

At this point, the C-face sapphire substrate 1 and the handle substrate 2 are bonded via the thin film 1a. Alternatively, the C-face sapphire substrate 1 and the handle substrate 2 are bonded in close contact if the thin film 1a is not formed.

Prior to the attachment, either one or both of the ion-implanted surface of the C-face sapphire substrate 1 and the bonding surface of the handle substrate 2 are preferably subjected to surface activation treatment, typically plasma treatment.

For example, surface activation treatment may be carried out by setting the C-face sapphire substrate 1 and/or the handle substrate 2 subject to surface activation treatment in a conventional parallel plate type plasma chamber, applying a high frequency energy of about 13.56 MHz and about 100 W, and feeding Ar, $N_2$, $O_2$ or the like as the process gas. The treatment time may be 5 to 30 seconds. This treatment activates the surface of the relevant substrate(s), increasing the bond strength after the attachment.

Additionally, a tighter bond is formed by annealing at about 200 to 300° C. after the attachment.

(Step 1-5: Separating and Transferring C-Face Sapphire Thin Film)

Next, a C-face sapphire thin film 1t is separated along the ion-implanted region $1_{ion}$ in the C-face sapphire substrate 1 and transferred to the handle substrate 2 (FIG. 1(e)).

The separating treatment may be any of treatments commonly employed in the ion implantation separation method, for example, mechanical separation such as blade insertion, optical separation such as laser beam irradiation, and physical impact separation such as water jet or ultrasonic.

In this way, there is obtained a GaN epitaxial growth substrate 11 in which a C-face sapphire thin film 1t having an off angle of 0.5 to 5°, preferably 2 to 3° and a flat surface is disposed on the handle substrate 2.

The smaller the warpage of the GaN epitaxial growth substrate 11 is, the better the results are. In practice, the warpage is preferably up to 300 µm, more preferably up to 200 µm, and even more preferably up to 150 µm, provided that the substrate is dimensioned to a diameter of at least 150 mm or 6 inches (the upper limit of diameter is typically up to 300 mm or 12 inches though not critical). This facilitates the subsequent treatment steps.

It is noted that the warpage of the GaN epitaxial growth substrate 11 refers to a difference in height between the center and the end of the GaN epitaxial growth substrate 11 when the GaN epitaxial growth substrate 11 is placed with the C-face sapphire thin film 1t faced upward (front surface side), and is expressed in minus values when the center portion of the substrate is convex downward or in plus values when the center portion of the substrate is convex upward. For the measurement of warpage, a Fizeau interferometer of perpendicular incidence type (Flat Master by Corning Tropel) may be used (the same applies to Examples).

In the method for producing a GaN laminate substrate according to the invention, a GaN laminate substrate is produced, as shown in FIG. 2, by carrying out step (a) of furnishing a GaN epitaxial growth substrate and a support substrate (step 2-1), (b) of surface treating the GaN epitaxial growth substrate (step 2-2), (c) of GaN epitaxial growth (step 2-3), (d) of ion implantation treatment (step 2-4), (e) of attaching and bonding (step 2-5), and (f) of separating and transferring a GaN thin film (step 2-6) in sequence.

(Step 2-1: Furnishing GaN Epitaxial Grow Substrate and Support Substrate)

There are first furnished the GaN epitaxial growth substrate 11 and a support substrate 12 (FIG. 2(a)).

The GaN epitaxial growth substrate 11 has been prepared by the above-mentioned procedure and bears the C-face sapphire thin film 1t having an off angle of 0.5 to 5°, preferably 2 to 3° on the handle substrate 2.

An off angle in this range ensures that a GaN film 13 which is later formed on the C-face sapphire thin film 1t becomes an epitaxial growth film having a front surface which is a N polarity surface (N surface, hereinafter), improved smoothness, and good crystallinity, and furthermore that when a portion of the GaN film is separated by the ion implantation separation technique and transferred to the support substrate 12, the transferred thin film 13a has improved smoothness.

Also, preferably the C-face sapphire thin film 1t has an arithmetic average roughness Ra of up to 0.5 nm on its front surface. This ensures that the GaN film 13 resulting from epitaxial growth has a smoother surface and forms a tighter bond to the support substrate 12 after attachment and bonding.

The support substrate 12 is a substrate for finally supporting the GaN thin film 13a and is preferably made of Si, $Al_2O_3$, SiC, AlN or $SiO_2$. The material of which the support substrate 12 is made may be suitably selected depending on the application of semiconductor devices which are fabricated using the resulting GaN laminate substrate.

The support substrate 12 preferably has an arithmetic average roughness Ra of up to 0.5 nm on its front surface. This ensures that a tighter bond is established upon bonding to the GaN layer carrier having GaN layer 13 on GaN epitaxial growth substrate 11.

Also, a bond film of silicon oxide (SiOx thin film wherein 0<x≤2) may be formed as the outermost layer on the support substrate 12 by the sputtering technique, plasma CVD technique, or thermal oxidation technique where the support substrate 12 is made of Si, except the embodiment wherein the support substrate 12 is made of $SiO_2$. Further, when the surface roughness of the support substrate 12 itself is not fully small (for example, the support substrate 12 has an arithmetic average roughness Ra in excess of 0.5 nm on its front surface), the bond film may be treated by chemical-mechanical polishing (CMP) or otherwise to smooth its surface. This ensures that a higher bond strength is established upon bonding to the GaN epitaxial growth substrate 11 and the GaN layer carrier having GaN layer 13.

It is noted that the bond film preferably has a thickness of approximately 300 to 1.000 nm.

(Step 2-2: Surface Treatment of GaN Epitaxial Growth Substrate)

Next the GaN epitaxial growth substrate is subjected to surface treatment (FIG. 2(b)).

That is, the GaN epitaxial growth substrate is surface treated by effecting high-temperature nitriding treatment at 800 to 1,000° C. on the GaN epitaxial growth substrate 11 and/or deposition treatment of crystalline AlN on the C-face sapphire thin film 1t of the GaN epitaxial growth substrate 11. Thus, the surface of the C-face sapphire thin film 1t is covered with a surface treated layer 11a.

Of the surface treatments, the high-temperature nitriding treatment of the GaN epitaxial growth substrate 11 includes heating the GaN epitaxial growth substrate 11 in a nitrogen-containing atmosphere at a temperature which is slightly lower than the temperature of subsequent GaN epitaxial growth, specifically 800 to 1,000° C., for thereby forming an AlN film as the surface treated layer 11a at least on the surface of the C-face sapphire thin film 1t. This treatment is preferably carried out in-situ in a common treatment chamber of a MOCVD unit for epitaxial growth of GaN film, and at a temperature (800 to 1,000° C.) which is slightly lower than the temperature (1,050 to 1,100° C.) of GaN epitaxial growth. If the treatment temperature is lower than 800° C., N polarity growth of GaN film does not take place. If the treatment temperature exceeds 1,000° C., GaN formed by subsequent epitaxial growth is degraded in smoothness. Typically, pure nitrogen is used as the process gas while use of ammonia gas is acceptable because more active nitrogen atoms are generated from ammonia whereby the surface morphology (crystal structure) of GaN film is improved. Also, the time of high-temperature nitriding treatment may be about 30 seconds to about 30 minutes. By prolonging the treatment time, the surface morphology (crystal structure) of GaN film may be improved.

The deposition treatment of crystalline AlN on the C-face sapphire thin film 1t is to form a crystalline AlN film as the surface treated layer 11a on the C-face sapphire thin film 1t by the sapphire nitriding, chemical vapor deposition (CVD) or physical vapor deposition (PVD) technique. This deposition treatment is carried out under such conditions that at least the surface of the C-face sapphire thin film 1t may be covered with the crystalline AlN film (surface treated layer 11a).

After the crystalline AlN film as the surface treated layer 11a is formed on the C-face sapphire thin film 1t in the above-described way, preferably the crystalline AlN film is stabilized by heat treatment prior to GaN epitaxial growth.

(Step 2-3: GaN Epitaxial Growth)

After the surface treatment, GaN is epitaxially grown on the surface treated layer 11a of the C-face sapphire thin film 1t to form a GaN film 13 having, a front surface which is a N polarity surface, completing a GaN film carrier.

Known methods for epitaxial growth of GaN film include molecular beam epitaxy (MBE), hydride vapor phase epitaxy (HVPE), and metal-organic chemical vapor deposition (MOCVD) methods. Of these, the MOCVD method is best suited and preferred for the direct growth of a substantially defect-free GaN thin film on the C-face sapphire thin film 1t.

Herein, the epitaxial growth of GaN film 13 by the MOCVD method is preferably carried out above 1,000° C., and where high-temperature nitriding treatment is carried out in step 2-2, preferably at a temperature higher than the treatment temperature, more preferably at a temperature from higher than 1,000° C. to 1,200° C. for a balance between the quality and the deposition rate of the GaN film 13. It is also recommended to use trimethylgallium (TMG) and ammonia ($NH_3$) as the process gas and hydrogen as the carrier gas.

The thickness of the GaN film 13 depends on the thickness of the finally desired GaN thin film 13a and is typically 1 to 30 μm.

In the preferred embodiment, after the surface treatment of the C-face sapphire thin film 1t in step 2-2, a GaN buffer layer is formed on the surface treated layer 11a at a low temperature, for example, 700° C. or lower, and GaN epitaxial growth by the MOCVD method is then carried out on this GaN buffer layer to form the GaN film 13.

The deposition of the GaN buffer layer is preferably carried out at a temperature of 400 to 700° C., more preferably 400 to 600° C. for the reason that if the deposition temperature is above 700° C., the GaN film 13 does not faithfully conform to N polarity growth on the buffer layer, and if the deposition temperature is below 400° C., deposition does not take place. Also, the thickness of the GaN buffer layer is preferably 20 to 40 nm, more preferably 20 to 25 nm for the reason that a too thin layer may achieve no or little buffer effect whereas a too thick layer may suffer a lowering of film quality.

Through the above-mentioned series of steps for forming the GaN film 13 (down to FIG. 2(c)), the GaN film 13 having N surface as the front surface and excellent crystallinity is formed on the C-face sapphire thin film 1t (specifically surface treated layer 11a) of the GaN epitaxial growth substrate 11.

The surface of compound semiconductor crystal such as GaN has a polarity. For example, a single crystal GaN film consisting of constituents Ga and N naturally has a polarity surface (Ga polarity surface or Ga surface) consisting of or terminated with Ga atoms with free valence bonds of Ga atoms being exposed, and a polarity surface (N polarity surface or N surface) consisting of or terminated with N atoms with free valence bonds of N atoms being exposed.

Also, the crystal structure of GaN is hexagonal and its polarity surface develops on the close-packed plane of crystal lattice. It is noted that the close-packed plane of hexagonal compound semiconductor crystal is {0001} plane, and (0001) and (000-1) planes are not equivalent in that the former is a plane with cation atoms exposed and the latter is a plane with anion atoms exposed. In the case of gallium nitride (GaN), (0001) plane is Ga surface and (000-1) plane is N surface.

After the GaN film 13 is formed by epitaxial growth, a silicon oxide film (SiOx wherein 0<x≤2) may be formed on the GaN film 13 as a bond layer for attachment to the support substrate 12 by sputtering, plasma-assisted CVD or the like, completing the GaN film carrier. In this embodiment, the silicon oxide film preferably has a thickness (or thickness after optional CMP) of 200 to 1,000 nm.

(Step 2-4: Ion Implantation to GaN Film 13)

Next, ion implantation is effected on the surface of the GaN film 13 of the GaN film carrier to define an ion-implanted layer or region $13_{ion}$ in the GaN film 13 (FIG. 2(d)).

Herein, hydrogen ions ($H^+$) and/or hydrogen molecule ions ($H_2^+$) are preferably used as the implanting ion.

The implanting energy, which determines the depth of ion implantation (that is the thickness of separating film or GaN thin film 13a), is preferably 100 to 160 keV. When the implanting energy is equal to or more than 100 keV, the thickness of the GaN thin film 13a may be 500 nm or more. If the implanting energy exceeds 160 keV, implanting damages become noticeable, with the risk of degrading the crystallinity of separated thin film.

Also the dose is preferably $1.0 \times 10^{17}$ to $3.5 \times 10^{17}$ atoms/cm$^2$. In this dose range, an ion-implanted region $13_{ion}$ which becomes a separation layer (embrittled layer) can be formed in the GaN film 13 and any temperature rise of the GaN film carrier is prevented. Notably, the ion implantation temperature is room temperature. It is acceptable that the GaN film carrier is cooled because the GaN film carrier can be broken at high temperatures.

The ion implantation treatment may be applied to the GaN film carrier having the GaN film 13 as formed thereon in the previous step 2-3. If the surface of the GaN film 13 as formed is rough, the depth of ion implantation becomes irregular in conformity to the surface roughness or irregularity, and the separation surface (front surface) of the GaN thin film 13a after separation becomes noticeably rough or irregular.

It is then recommended that prior to the ion implantation, the surface of the GaN film carrier subject to ion implantation be smoothed to an arithmetic average roughness of preferably 0.3 nm or less, more preferably 0.2 nm or less.

For example, the surface of the GaN film 13 formed in step 2-3 may be smoothed to an arithmetic average roughness Ra of preferably 0.3 nm or less, more preferably 0.2 nm or less by polishing, typically CMP and/or etching.

Alternatively, in the embodiment wherein the silicon oxide film is formed as the bond layer on the GaN film 13 (i.e., the GaN film 13 as deposited or as smoothed by polishing and/or etching), the silicon oxide film surface may be smoothed to an arithmetic average roughness Ra of preferably 0.3 nm or less by polishing, typically CMP and/or etching. This is effective when the GaN film 13 is so thin that smoothing by polishing is difficult.

Now that the surface of the GaN film carrier subject to ion implantation (that is, the surface of the GaN film 13 or the silicon oxide film as the bond layer) is smoothed as described above, the ion implantation depth of the subsequent ion implantation treatment becomes constant and hence, a separated/transferred layer (GaN thin film 13a) having a smooth surface (reduced surface roughness) is obtained after attachment to the support substrate 12 and subsequent separation.

(Step 2-5: Attaching and Bonding GaN Film Carrier to Support Substrate 12)

Next, the surface of GaN film 13 on the ion-implanted GaN film carrier is attached and bonded to the support substrate 12 (FIG. 2(e)).

In the embodiment wherein the GaN film carrier not having the bond layer (silicon oxide film) formed thereon is attached to the support substrate 12, the surface (N surface) of the GaN film 13 of the GaN film carrier is bonded to the surface of the support substrate 12. That is, there is obtained a laminate structure of GaN epitaxial growth substrate 11 (handle substrate 2/thin film 1a/C-face sapphire thin film 1t)/surface treated layer 11a/(GaN buffer layer)/GaN film 13 (N surface)/support substrate 12.

In the embodiment wherein the GaN film carrier having the bond layer (silicon oxide film) formed on any surface thereof is attached to the support substrate 12, the surface (N surface) of the GaN film 13 of the GaN film carrier is bonded to the surface of the support substrate 12 via the intervening bond layer (silicon oxide film). That is, there is obtained a laminate structure of GaN epitaxial growth substrate 11 (handle substrate 2/thin film 1a/C-face sapphire thin film 1t)/surface treated layer 11a/(GaN buffer layer)/GaN film 13 (N surface)/bond layer (silicon oxide film)/support substrate 12.

Prior to the attachment, either one or both of the ion-implanted surface of the GaN film carrier and the bonding surface of the support substrate 12 are preferably subjected to surface activation treatment, typically plasma treatment.

For example, surface activation treatment may be carried out by setting the GaN film carrier and/or the support substrate 12 subject to surface activation treatment in a conventional parallel plate type plasma chamber, applying a high frequency energy of about 13.56 MHz and about 100 W, and feeding Ar, $N_2$, $O_2$ or the like as the process gas. The treatment time may be 5 to 30 seconds. This treatment activates the surface of the relevant substrate(s), increasing the bond strength after the attachment.

Additionally, a tighter bond is formed by annealing at about 200 to 300° C. for about 5 to 24 hours after the attachment.

(Step 2-6: Separating and Transferring GaN Thin Film)

Next, a GaN thin film 13a is separated along the ion-implanted region $13_{ion}$ in the GaN film 13 and transferred to the support substrate 12 (FIG. 2(f)).

The separating treatment may be any of treatments commonly employed in the ion implantation separation method, for example, mechanical separation such as blade insertion, optical separation such as laser beam irradiation, and physical impact separation such as water jet or ultrasonic.

In this way, there is obtained a GaN laminate substrate 10 having a GaN thin film 13a on the support substrate 12, the GaN thin film 13a having a front surface which is Ga polarity surface, good crystallinity and a smooth surface.

Notably, although the surface of the GaN thin film 13a after separation and transfer is sufficiently smooth, the surface may be further smoothed by polishing or the like depending on the required properties of devices which are fabricated from the GaN laminate substrate 10. Also, a substantially defect-free, thick film GaN substrate can be produced by further effecting epitaxial growth of a GaN film on the GaN laminate substrate 10.

With respect to the method for determining the polarity of the surface of the GaN thin film 13a of the GaN laminate substrate 10, for example, polarity may be judged in terms of a difference in etching rate in a KOH aqueous solution. Specifically, the N surface shows a greater etching rate than the Ga surface. For example, when the film is immersed in a 2 mol/L KOH aqueous solution at 40° C. for 45 minutes, the Ga surface is not etched and the N surface is etched.

EXAMPLES

Examples and Comparative Examples are given below for further illustrating the invention, but the invention is not limited thereto.

Example 1

A GaN laminate substrate was produced under the following conditions.

Example 1-1

There were furnished a handle substrate in the form of an AlN sintered body (ceramic) having a diameter of 12 inches, a thickness of 750 μm, and a CTE of $5.2\times10^{-6}$/K (800K) and a C-face sapphire substrate having a diameter of 12 inches, a thickness of 750 μm, an arithmetic average roughness Ra of 0.3 nm, a CTE of $8.0\times10^{-6}$/K (800K), and a c-axis off angle of 1.5°. The difference in CTE of the handle substrate from GaN (CTE $6.0\times10^{-6}$/K (800K)) is $-0.8\times10^{-6}$/K.

A $SiO_2$ thin film of 150 nm thick was formed on the surface of the C-face sapphire substrate by sputtering. Then hydrogen molecular ions $H_2^+$ were implanted into the surface of the $SiO_2$ thin film under conditions: an implantation energy of 150 keV and a dose of $2\times10^{17}$ atoms/cm$^2$.

Next, the ion-implanted surface ($SiO_2$ thin film-bearing surface) of the C-face sapphire substrate and the surface of the handle substrate were subjected to Ar plasma treatment. The Ar plasma treated surfaces of the substrates were attached and bonded together, after which the C-face sapphire substrate was mechanically separated or cleaved along the ion-implanted region from the bonded structure. In this way, a C-face sapphire thin film was transferred onto the handle substrate, yielding a GaN epitaxial growth substrate. This GaN epitaxial growth substrate showed a warpage of 100 μm.

The substrate was cleaned by the RCA clean. In a MOCVD unit, high-temperature nitriding treatment (pure nitrogen as the process gas) at a substrate temperature of 900° C. was carried out for 30 minutes. Subsequently, a GaN buffer layer was deposited to a thickness of 20 nm at a substrate temperature of 400° C., and a GaN film was formed to a thickness of 10 μm by epitaxial growth using TMG and $NH_3$ as the process gas at a substrate temperature of 1,050° C. The GaN film had an arithmetic average roughness Ra of 8 nm.

Next, a silicon oxide film of 2 μm thick was deposited as the bond layer on the GaN film by the plasma assisted CVD method. Using a CMP apparatus, the silicon oxide film was polished to 300 nm. The resulting GaN film carrier had an arithmetic average roughness Ra of 0.3 nm.

Then hydrogen molecule ions $H_2^+$ were implanted into the surface of the silicon oxide film of the GaN film carrier under conditions: an implantation energy of 160 keV and a dose of $3.1\times10^{17}$ atoms/cm$^2$.

Next, a Si substrate having a diameter of 12 inches and a thickness of 750 μm was furnished as the support substrate. A thermal oxide film of 300 nm thick was formed on the Si substrate. The Si substrate having a thermal oxide film formed thereon had an arithmetic average roughness Ra of 0.5 nm.

The surface of the thermal oxide film on the Si substrate and the (ion implanted) surface of the silicon oxide film on the GaN film carrier were subjected to Ar plasma treatment. Then the plasma treated surfaces were attached together, followed by annealing in a nitrogen atmosphere at 200° C. for 12 hours. After the annealing, separation was carried out by inserting a metal blade into the ion implanted region of the GaN film whereby a GaN thin film was transferred onto the Si substrate, yielding a GaN laminate substrate.

The resulting GaN laminate substrate had an arithmetic average roughness Ra of 10 nm on the GaN thin film surface. The GaN thin film of the GaN laminate substrate was evaluated for crystallinity by the X-ray rocking curve method. Specifically, by X-ray diffractometry, a tilt distribution (full width of half maximum (FWHM)) of a rocking curve (ω scan) as reflected on GaN (0002) plane of the GaN thin film was determined to be 310 arcsec, indicating good crystallinity.

Also for determining the polarity of the GaN thin film surface, a sample was immersed in 2 mol/L KOH aqueous solution at 40° C. for 45 minutes, after which the surface was observed. The GaN thin film surface was not etched, proving that the GaN thin film surface was Ga surface.

Example 1-2

A GaN epitaxial growth substrate was produced as in Example 1-1 except that the handle substrate was made of borosilicate glass (CTE $6.8\times10^{-6}$/K (800K)) and the C-face sapphire substrate had an off angle of 3° (arithmetic average roughness Ra 0.3 nm). This GaN epitaxial growth substrate showed a warpage of 150 μm.

Then a GaN film of 5 μm thick was formed on the GaN epitaxial growth substrate by epitaxial growth. The surface of the GaN film (arithmetic average roughness Ra 6 nm) was CMP polished to an arithmetic average roughness Ra of 0.2 nm. The GaN film was directly (without forming the bond layer) transferred to a support substrate of quartz (quartz substrate). Otherwise as in Example 1-1, a GaN laminate substrate was obtained.

The resulting GaN laminate substrate had an arithmetic average roughness Ra of 0.3 nm on the GaN thin film surface. As in Example 1-1, the GaN thin film of the GaN laminate substrate was evaluated for crystallinity by the X-ray rocking curve method, finding a FWHM value of 280 arcsec, which indicated crystallinity comparable to Example 1-1.

Also, the GaN thin film surface was determined for polarity as in Example 1-1, confirming Ga surface.

Comparative Example 1-1

A GaN laminate substrate was obtained as in Example 1-1 except that a C-face sapphire substrate having a c-axis off angle of 0.05° (arithmetic average roughness Ra 0.3 nm) was used in Example 1-1. After GaN film formation, the GaN film had an arithmetic average roughness Ra of 135 nm. After CMP of the silicon oxide film, the GaN film carrier had an arithmetic average roughness Ra of 0.2 nm.

The resulting GaN laminate substrate had an arithmetic average roughness Ra of 150 nm on the GaN thin film surface, indicating poor smoothness. As in Example 1-1, the GaN thin film of the GaN laminate substrate was evaluated for crystallinity by the X-ray rocking curve method, finding a FWHM value of 850 arcsec, which indicated degraded crystallinity.

Also, the GaN thin film surface was determined for polarity as in Example 1-1, confirming Ga surface.

Comparative Example 1-2

A GaN laminate substrate was obtained as in Example 1-1 except that a C-face sapphire substrate having a c-axis off angle of 6° (arithmetic average roughness Ra 0.3 nm) was used in Example 1-1. After GaN film formation, the GaN film had an arithmetic average roughness Ra of 80 nm. After CMP of the silicon oxide film, the GaN film carrier had an arithmetic average roughness Ra of 0.3 nm.

The resulting GaN laminate substrate had an arithmetic average roughness Ra of 120 nm on the GaN thin film surface. As in Example 1-1, the GaN thin film of the GaN laminate substrate was evaluated for crystallinity by the X-ray rocking curve method, finding a FWHM value of 960 arcsec, which indicated degraded crystallinity.

Also, the GaN thin film surface was determined for polarity as in Example 1-1, confirming Ga surface.

Comparative Example 1-3

The C-face sapphire substrate of Example 1-1 was used as a GaN epitaxial growth substrate, and a GaN film was formed on this GaN epitaxial growth substrate as in Example 1-1. Because of a significantly large warpage of ~3 mm, the substrate having the GaN film formed thereon could not be attached to the support substrate. The subsequent steps were interrupted.

The foregoing results are tabulated in Table 1. It is demonstrated that according to the invention, a GaN laminate substrate having improved smoothness and crystallinity is obtained even from a substrate having a diameter as large as 12 inches. It is noted that the surface roughness Ra in Table 1 is an arithmetic average roughness Ra.

TABLE 1

| | | Preparation of GaN epitaxial growth substrate | | Surface treatment | GaN epitaxial growth | | | | | | GaN thin film transfer | Evaluation results of GaN transfer thin film | |
|---|---|---|---|---|---|---|---|---|---|---|---|---|---|---|
| | | | | High-temperature nitriding treatment Treating conditions | GaN buffer layer | GaN film | | Bond layer formation | | | | | | |
| | Handle substrate Constituent material | C-face sapphire substrate c-axis off angle | C-face sapphire thin film transfer | | Thickness (nm) | Surface roughness Ra after film formation | CMP | Silicon oxide film Deposition | CMP | Surface roughness Ra | Support substrate Substrate material | Surface roughness Ra | Crystallinity* |
| Example 1-1 | AlN sintered body | 1.5° | yes | 900° C./30 min | 20 nm | 8 nm | no | yes | yes | 0.3 nm | Si substrate (thermal oxide film formed) | 10 nm | 310 arcsec |
| 1-2 | borosilicate glass | 3° | yes | 900° C./30 min | 20 nm | 6 nm | yes | no | no | 0.2 nm | quartz substrate | 0.3 nm | 280 arcsec |
| Comparative Example 1-1 | AlN sintered body | 0.05° | yes | 900° C./30 min | 20 nm | 135 nm | no | yes | yes | 0.2 nm | Si substrate (thermal oxide film formed) | 150 nm | 850 arcsec |
| 1-2 | AlN sintered body | 6° | yes | 900° C./30 min | 20 nm | 80 nm | no | yes | yes | 0.3 nm | Si substrate (thermal oxide film formed) | 120 nm | 960 arcsec |
| 1-3 | — | 1.5° | no | 900° C./30 min | 20 nm | 110 nm | — | — | — | — | — | — | — |

*FWHM of rocking curve (ω scan) of GaN (0002) plane reflection.

It is noted that although various embodiments of the invention have been described, the invention is not limited to these embodiments. Other embodiments, modifications, changes and deletion may be made as long as they occur to the skilled artisan. All such embodiments fall within the scope of the invention as long as the functions and benefits of the invention are exerted.

REFERENCE SIGNS LIST 1, 1' C-face sapphire substrate
1a thin film
$1_{ion}$, $13_{ion}$ ion implanted region
1t C-face sapphire thin film
2 handle substrate
10 GaN laminate substrate
11 GaN epitaxial growth substrate
11a surface treated layer
12 support substrate
13 GaN film
13a GaN thin film

The invention claimed is:

1. A method for producing a GaN laminate substrate, comprising the steps of:
  transferring a C-face sapphire thin film, which is separated from a C-face sapphire substrate having an off-angle of 0.5 to 5° by the ion-implantation separation technique, onto a handle substrate composed of a glass, ceramic or single crystal material having a coefficient of thermal expansion at 800K which is greater than that of silicon and less than that of C-face sapphire, to construct a GaN epitaxial growth substrate;
  performing high-temperature nitriding treatment on the GaN epitaxial growth substrate at 800 to 1,000° C. and/or deposition treatment of crystalline AlN on the C-face sapphire thin film of the GaN epitaxial growth substrate, for thereby covering the surface of the C-face sapphire thin film with a surface treated layer of AlN;
  effecting GaN epitaxial growth on the surface treated layer of the surface treated GaN epitaxial growth substrate, to construct a GaN film carrier having a front surface which is an N-polarity surface;
  subjecting the GaN film to ion implantation to form an ion-implanted region;
  attaching and bonding together the GaN film-side surface of the ion-implanted GaN film carrier and a support substrate; and
  separating a GaN thin film from the GaN film along the ion-implanted region and transferring the GaN thin film onto the support substrate, thereby obtaining a GaN laminate substrate having the GaN thin film on the support substrate, the GaN thin film having a front surface which is a Ga-polarity surface.

2. The method of claim 1 wherein the handle substrate is composed of a borosilicate glass, GaN sintered body, AlN sintered body or GaAs single crystal.

3. The method of claim 1 wherein in the step of transferring a C-face sapphire thin film onto a handle substrate, a thin film of silicon oxide, silicon nitride or silicon oxynitride is interposed between the handle substrate and the C-face sapphire thin film.

4. The method of claim 1 wherein the GaN epitaxial growth substrate has a warpage of up to 300 μm.

5. The method of claim 1 wherein the step of effecting GaN epitaxial growth is at a temperature from higher than 1,000° C. to 1,200° C.

6. The method of claim 1 wherein the step of effecting GaN epitaxial growth is by the MOCVD technique.

7. The method of claim 1 wherein after the surface treatment of the C-face sapphire substrate, a GaN buffer layer is formed on the surface treated layer at 700° C. or lower, and the GaN epitaxial growth is then effected on the GaN buffer layer.

8. The method of claim 7 wherein the GaN buffer layer has a thickness of 20 to 40 nm.

9. The method of claim 1 wherein after the formation of the GaN film by epitaxial growth, a silicon oxide film is formed on the GaN film to construct the GaN film carrier.

10. The method of claim 1 wherein prior to the ion implantation, the surface of the GaN film carrier subject to ion implantation is smoothed to an arithmetic average roughness Ra of 0.3 nm or less.

11. The method of claim 1 wherein the ion implantation to the GaN film is a treatment using hydrogen ions ($H^+$) and/or hydrogen molecule ions ($H_2^+$) in an implantation energy of 100 to 160 keV and a dose of $1.0 \times 10^{17}$ to $3.5 \times 10^{17}$ atoms/cm$^2$.

12. The method of claim 1 wherein the support substrate is made of Si, $Al_2O_3$, SiC, AlN or $SiO_2$.

13. The method of claim 12 wherein the support substrate has a silicon oxide film formed on its surface to be bonded to the GaN film carrier, except for cases where the support substrate is made of $SiO_2$.

* * * * *